United States Patent
Kuo et al.

(10) Patent No.: US 11,450,657 B2
(45) Date of Patent: Sep. 20, 2022

(54) SEMICONDUCTOR DEVICE WITH IMPROVED ELECTROSTATIC DISCHARGE OR ELECTRO-OVER STRESS PROTECTION

(71) Applicant: Taiwan Semiconductor Manufacturing Co., Ltd., Hsinchu (TW)

(72) Inventors: Hsi-Yu Kuo, Hsinchu (TW); Yu-Lin Chu, Hsinchu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 16/899,584

(22) Filed: Jun. 12, 2020

(65) Prior Publication Data

US 2020/0312837 A1 Oct. 1, 2020

Related U.S. Application Data

(62) Division of application No. 15/965,990, filed on Apr. 30, 2018, now Pat. No. 10,685,956.

(60) Provisional application No. 62/610,954, filed on Dec. 28, 2017.

(51) Int. Cl.
*H01L 29/73* (2006.01)
*H01L 27/02* (2006.01)
*H01L 29/66* (2006.01)

(52) U.S. Cl.
CPC ........ *H01L 27/0259* (2013.01); *H01L 27/027* (2013.01); *H01L 29/66234* (2013.01); *H01L 29/73* (2013.01)

(58) Field of Classification Search
None
See application file for complete search history.

(56) References Cited

U.S. PATENT DOCUMENTS

| 5,541,433 A * | 7/1996 | Lien ...................... H01L 29/732 257/378 |
| 2005/0082542 A1* | 4/2005 | Sumakeris ........ H01L 29/66068 438/105 |
| 2006/0063313 A1* | 3/2006 | Kelberlau ........... H01L 29/0619 257/E29.198 |
| 2011/0006361 A1* | 1/2011 | Darwish ............. H01L 29/7816 257/329 |
| 2015/0221731 A1* | 8/2015 | Zeng ................... H01L 29/7395 257/139 |
| 2016/0351561 A1* | 12/2016 | Senoo ................. H01L 29/4238 |

(Continued)

*Primary Examiner* — Bilkis Jahan
(74) *Attorney, Agent, or Firm* — JCIPRNET (57) ABSTRACT

A semiconductor device and a manufacturing method thereof are provided. The semiconductor device includes a substrate, a first well, a second well and doped regions. The substrate has heavily doped and lightly doped regions over the heavily doped region. The first wells are disposed in the lightly doped region and arranged as an array. The first wells have a conductive type opposite to a conductive type of the heavily doped and lightly doped regions. The second well is disposed in the substrate over the lightly doped region, and has an active region defined by an isolation structure. The first wells are overlapped with the second well. Top ends of the first wells are lower than a bottom end of the second well. The doped regions are separately located in the active region, and have a conductive type opposite to a conductive type of the second well.

20 Claims, 10 Drawing Sheets

(56) References Cited

U.S. PATENT DOCUMENTS

| | | | | |
|---|---|---|---|---|
| 2016/0359029 A1* | 12/2016 | Zeng | ................... | H01L 29/0834 |
| 2017/0345817 A1* | 11/2017 | Nishimura | .......... | H01L 27/0623 |
| 2018/0261666 A1* | 9/2018 | Zeng | ................... | H01L 29/7802 |

* cited by examiner

SEMICONDUCTOR DEVICE WITH IMPROVED ELECTROSTATIC DISCHARGE OR ELECTRO-OVER STRESS PROTECTION

CROSS-REFERENCE TO RELATED APPLICATION

This application is a divisional application of and claims the priority benefit of a prior application Ser. No. 15/965,990, filed on Apr. 30, 2018, now allowed. The prior application claims the priority benefit of U.S. provisional application Ser. No. 62/610,954, filed on Dec. 28, 2017. The entirety of the above-mentioned patent application is hereby incorporated by reference herein and made a part of this specification.

BACKGROUND

Electrostatic discharge (ESD) and electro-over stress (EOS) are significant causes of semiconductor device failures at all stages of manufacturing, assembly and test. Damages from ESD or EOS can cause either complete device failure or device weakness by parametric shift, locally heating, or otherwise by damaging oxides, junctions or device components. A parasitic bipolar junction transistor (BJT) essentially formed below a MOS transistor is often applied to conduct the sudden flow of electricity caused by an ESD/EOS event, so as to provide an ESD/EOS protection function.

However, an ESD/EOS protection performance of the BJT is often influenced by a change of carrier concentration profile of the components in the BJT. The change of carrier concentration profile can be resulted from a thermal treatment applied during a wafer manufacturing process. As a consequence of the change of carrier concentration profile of the BJT, an electrical characteristic and an ESD/EOS protection ability of the BJT is altered.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A through FIG. 2E are schematic cross-sectional views illustrating intermediate structures at various stages of the manufacturing method for a semiconductor device according to some embodiments of the present disclosure.

FIG. 3A through FIG. 3D are schematic top views illustrating the active region, the first well and the gate structures according to some embodiments of the present disclosure.

DETAILED DESCRIPTION

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

Figure 1A:
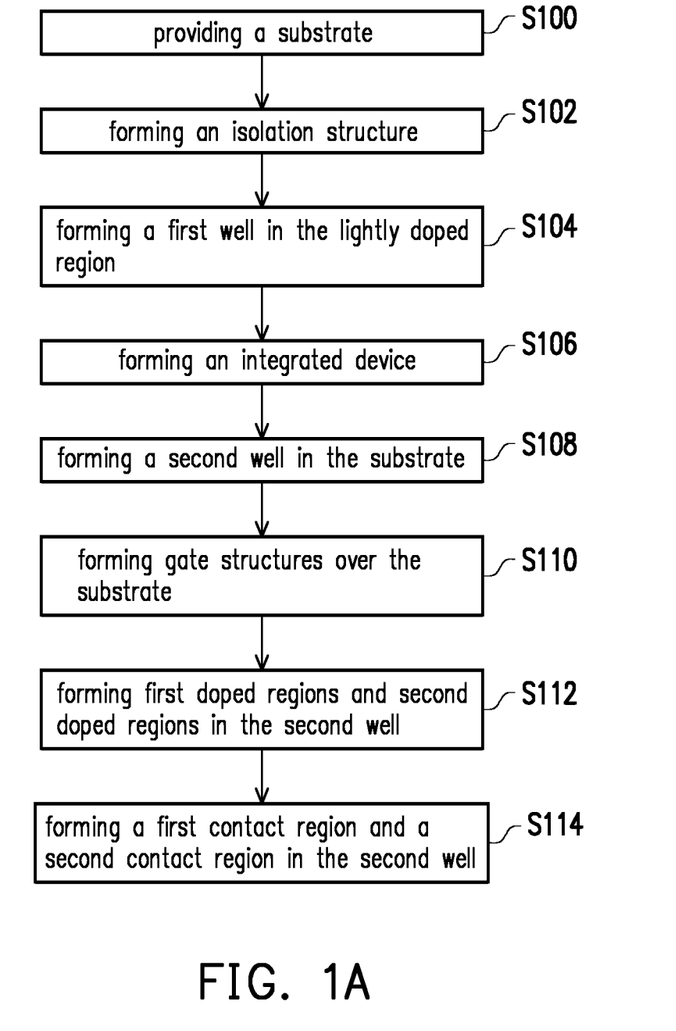
FIG. 1A and FIG. 1B are exemplary flow charts showing the process steps of manufacturing methods for a semiconductor device according to some embodiments of the present disclosure.
Figure 1B:
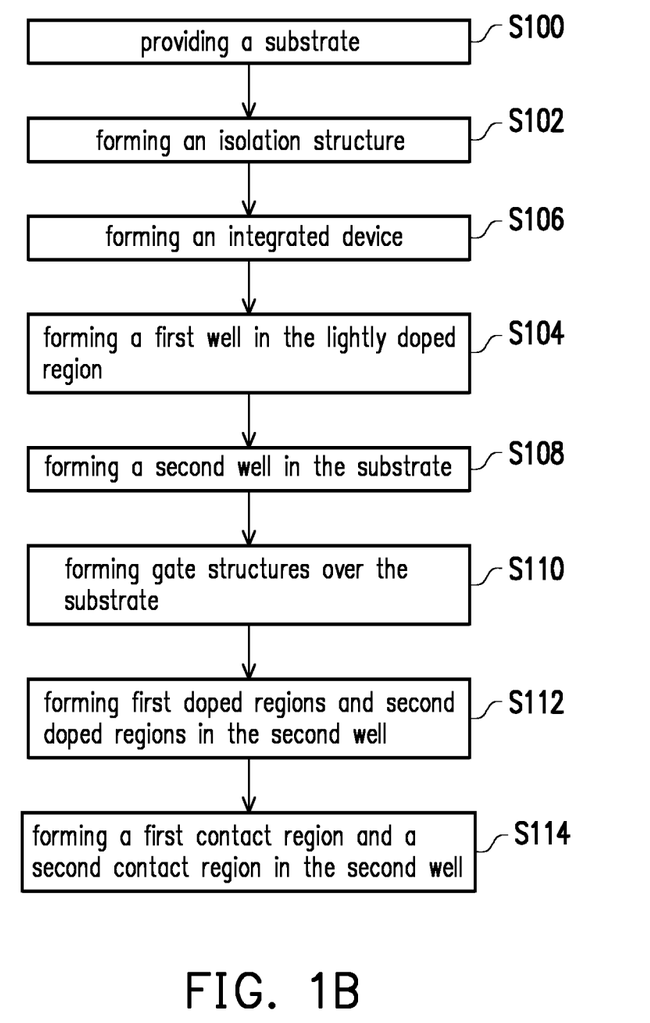

FIG. 1A and FIG. 1B are exemplary flow charts showing the process steps of manufacturing methods for a semiconductor device 10 according to some embodiments of the present disclosure. FIG. 2A through FIG. 2E are schematic cross-sectional views illustrating intermediate structures at various stages of the manufacturing method for the semiconductor device 10 according to some embodiments of the present disclosure.

Figure 2A:
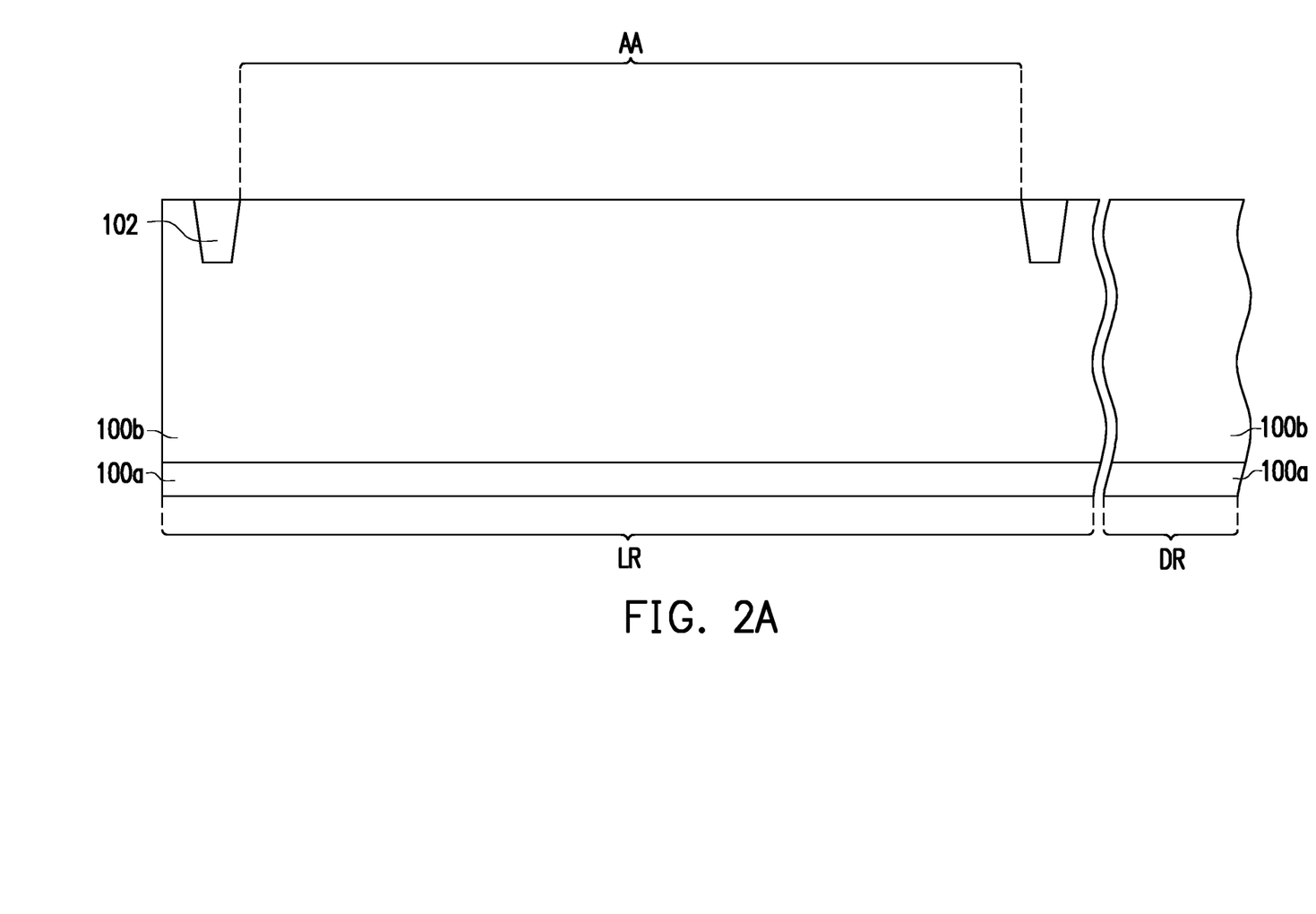

Referring to FIG. 1A and FIG. 2A, step S100 is performed and a substrate 100 is provided. In some embodiments, the substrate 100 may include a semiconductor wafer or an epitaxial wafer. The semiconductor wafer or the epitaxial wafer may include an elemental semiconductor material or a compound semiconductor material. For instance, the elemental semiconductor may include Si or Ge. The compound semiconductor may include SiGe, SiC, SiGeC, a III-V semiconductor or a II-VI semiconductor. For instance, the III-V semiconductor includes GaN, GaP, GaAs, AN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs or InAlPAs. The II-VI semiconductor may include CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe or HgZnSTe.

In some embodiments, the substrate 100 has at least a logic region LR and an integrated device region DR. The logic region LR and the integrated device region DR may occupy different areas of the substrate 100. In some embodiments, a logic circuit having a parasitic bipolar junction transistor (BJT) may be formed within the logic region LR. The BJT may be applied as an Electrostatic discharge (ESD) or electro-over stress (EOS) protection device operated below logic devices of the logic circuit. In some embodiments, one or more integrated devices providing a specific function may be formed within the integrated device region DR. For instance, the integrated device providing a specific function may include a sensing device, a memory device, a device with a power management function or the combinations thereof.

In some embodiments, the substrate 100 has a heavily doped region 100a and a lightly doped region 100b. The lightly doped region 100b is disposed over and above the heavily doped region 100a. In addition, the heavily doped region 100a and the lightly doped region 100b may extend across the whole area of the substrate 100. In some embodiments, the heavily doped region 100a and the lightly doped region 100b have the same conductive type. In some embodiments, the conductive type of the heavily doped region 100a and the lightly doped region 100b is P type. In alternative embodiments, the conductive type of the heavily doped region 100a and the lightly doped region 100b is N type. A doping concentration of the heavily doped region 100a is greater than a doping concentration of the lightly doped region 100b. In some embodiments, the doping concentration of the heavily doped region 100a ranges from $10^{22}$ cm$^{-3}$ to $10^{23}$ cm$^{-3}$. In some embodiments, the doping concentration of the lightly doped region 100b ranges from $10^{15}$ cm$^{-3}$ to $10^{17}$ cm$^{-3}$. In some embodiments, the substrate 100 is an epitaxial wafer. In these embodiments, the heavily doped region 100a may be a wafer substrate, and the lightly doped region 100b may be an epitaxial layer formed on the wafer substrate. In alternative embodiments, the substrate 100 is a silicon bulk wafer.

In some embodiments, step S102 is performed, and an isolation structure 102 is formed. The isolation structure 102 is formed in the substrate 100. In addition, the isolation structure 102 defines an active region AA for the logic circuit later to be formed over the logic region LR. In some embodiments, the isolation structure 102 is arranged to surround the active region AA for isolation. For instance, a material of the isolation structure 102 may include an insulating material, such as silicon oxide, silicon nitride or a combination thereof. In some embodiments, a method of forming the isolation structure 102 may include forming a recess from a top surface of the substrate 100, and then filling the insulating material in the recess to form the isolation structure 102. In alternative embodiments, the insulating material may be directly formed on the top surface of the substrate 100 to form the isolation structure. For instance, a method of filling or forming the insulating material may include oxidation, chemical vapor deposition (CVD), spin coating or a combination thereof.

Figure 2B:
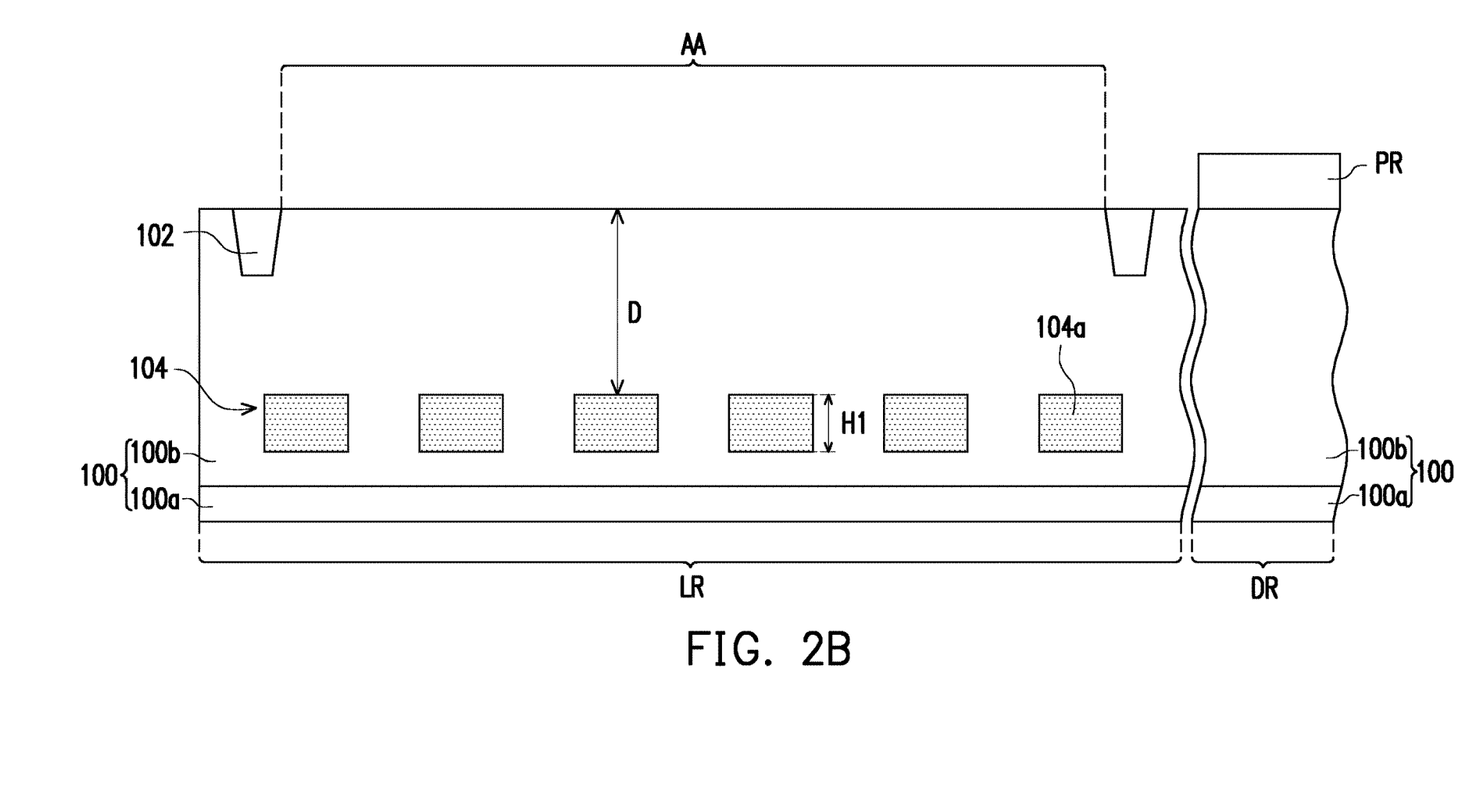

Referring to FIG. 1A and FIG. 2B, step S104 is performed, and a first well 104 is formed in the lightly doped region 100b. In some embodiments, the integrated device region DR is covered with a photoresist PR. In some embodiments, the first well 104 is formed within the logic region LR. The first well 104 has a conductive type different from or complementary to the conductive type of the heavily doped region 100a and the lightly doped region 100b. For instance, the conductive type of the heavily doped region 100a and the lightly doped region 100b is P type, whereas the conductive type of the first well 104 is N type. In some embodiments, a doping concentration of the first well 104 ranges from $10^{17}$ cm$^{-3}$ to $10^{20}$ cm$^{-3}$. In some embodiments, a depth D of the first well 104 from a top surface of the first well 104 to the top surface of the substrate 100 may range from 1.5 μm to 3 μm. In some embodiments, a thickness H1 (the span of the well in the vertical direction) of the first well 104 may range from 1.5 μm to 2.5 μm. In some embodiments, the first well 104 includes a plurality of sub-wells 104a. In some embodiments, the sub-wells 104a are separate from one another. In alternative embodiments, the first well 104 is a unified region and the first well 104 spans under the active region AA and extends over or beyond the whole area of the active region AA. In other words, in some embodiments, a distribution area of the first well may be greater than the area of the active region AA. In alternative embodiments, the distribution area of the first well may be equal to the area of the active region. In some embodiments, the first well 104 extends across the whole area of the logic region LR.

Figure 2C:
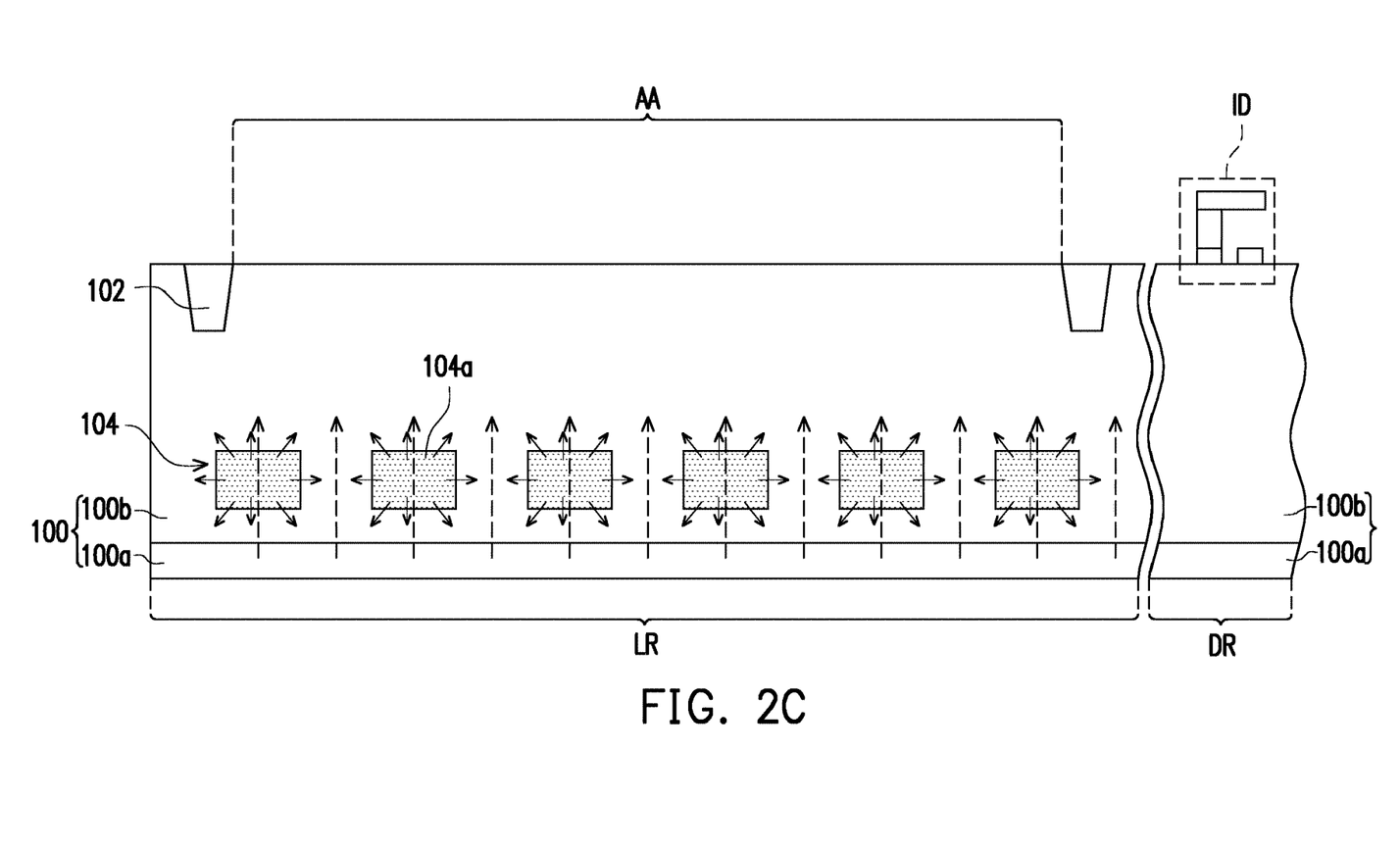

Referring to FIG. 1A and FIG. 2C, step S106 is performed and the above-mentioned integrated device ID is formed. In some embodiments, the integrated device ID is formed over the lightly doped region 100b within the integrated device region DR. In some embodiments, the integrated device ID includes a CMOS image sensor, a bipolar-CMOS-DMOS (BCD) device, a memory device or a combination thereof. In exemplary embodiments, the integrated device ID may be partially formed during step S106, and the exemplary arrangement of the integrated device ID is merely for illustration purposes but is not intended to limit the configuration, the number or the type of the integrated device ID in the present disclosure. In some embodiments, the step S106 of forming the integrated device ID includes performing an extremely high temperature thermal treatment to form certain elements of the integrated device ID. For instance, the extremely high temperature thermal treatment may be applied for forming a pixel in the CMOS image sensor (CIS) or for forming a high voltage device in the bipolar-CMOS-DMOS (BCD) device. In some embodiments, a temperature of the extremely high temperature thermal treatment ranges from 850° C. to 1150° C. High-temperature thermal treatment or annealing may impact the CMOS manufacturing processes in various aspects. For example, the high or extremely high temperature thermal treatment may cause the out-diffusion of dopants respectively from the heavily doped region 100a and the first well 104. In certain cases, during the extreme high temperature treatment, the dopants from the heavily doped region 100a may diffuse upwardly through the lightly doped region 100b within the logic region LR (shown as the dashed arrows pointed upwardly from the heavily doped region 100a in FIG. 2C), due to a concentration difference in between the heavily doped region 100b and the lightly doped region 100b. However, in exemplary embodiments, during the extreme high temperature treatment, dopants in the first well 104 (sub-wells 104a) diffuse out into the surrounding lightly doped region 100b within the logic region LR (shown as the arrows pointed from the first well 104 to the lightly doped region 100b in FIG. 2C). The conductive type of the dopants from the heavily doped region 100a is complementary to the conductive type of the dopants from the first well 104. Accordingly, carriers of the up-diffused dopants from the heavily doped region 100a can be neutralized by carriers of the out-diffused dopants from the first well 104.

Figure 2D:
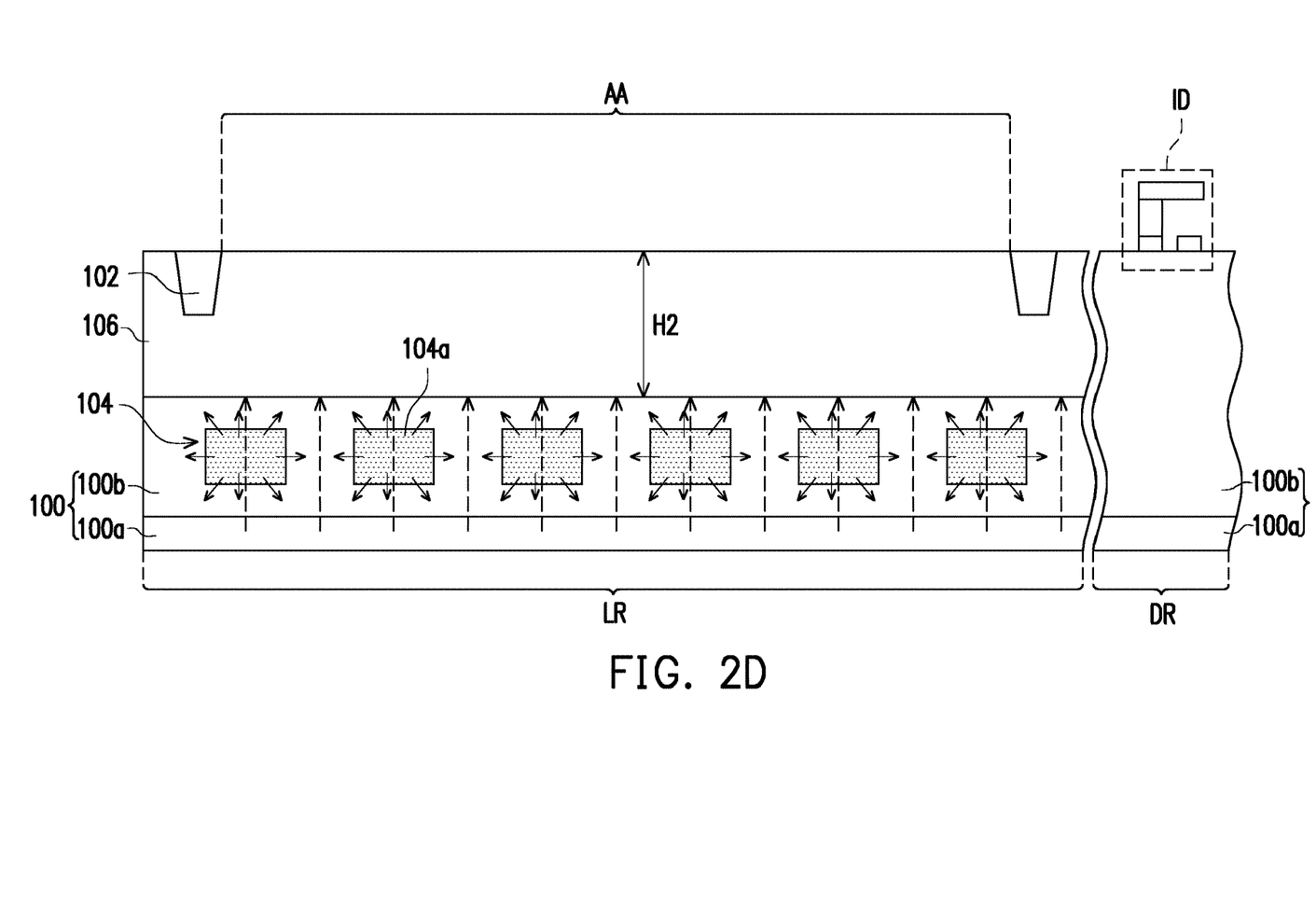

Referring to FIG. 1A and FIG. 2D, step S108 is performed, and a second well 106 is formed in the substrate 100. In some embodiments, the second well 106 is formed in the lightly doped region 100b, and extended up to the top surface of the substrate 100. In some embodiments, a location of the first well 104 overlaps a location of the second well 106 along the vertical direction. In some embodiments, the location of the second well 106 partially overlap the locations of the separate sub-wells 104a of the first well 104. However, in some embodiments, the second well 106 is spaced from the first well 104 and not in direct contact with the first well 104. In some embodiments, an orthogonal projection of the second well 106 on the heavily doped region 100a is overlapped with an orthogonal projection of the first well 104 on the heavily doped region 100a. In some embodiments, a thickness H2 (the span of the well in the vertical direction) of the second well 106 may range from 1 μm to 2 μm. In some embodiments, the second well 106 has a conductive type the same as the conductive type of the heavily doped region 100a and the lightly doped region 100b. For instance, the conductive type of the heavily doped region 100a, the lightly doped region 100b and the second well 106 is P type. In alternative embodiments, the second well 106 has a conductive type different from or complementary to the conductive type of the heavily doped region 100a and the lightly doped region 100b. For instance, the conductive type of the heavily doped region 100a and the lightly doped region 100b is P type, whereas the conductive type of the second well 106 is N type. In some embodiments, a doping concentration of the second well 106 ranges from $5 \times 10^{18}$ cm$^{-3}$ to $10^{19}$ cm$^{-3}$.

Since the varying and inconstant dopant concentration profile will alter the electrical characteristic and/or the ESD/EOS protection ability of the BJT formed therein, the arrangement of the first well 104 or the sub-wells 104a in the lightly doped region 100b helps to neutralize the carriers of the out-diffused and up-diffused dopants, and thus maintain a stable dopant concentration profile in the subsequently formed second well 106.

Referring to FIG. 1A, in some embodiments, the step S104 of forming the first well 104 precedes the step S106 of forming the integrated device ID. Referring to FIG. 1B, in alternative embodiments, the step S104 of forming the first well 104 may follow the step S106 of forming the integrated device ID.

Figure 2E:
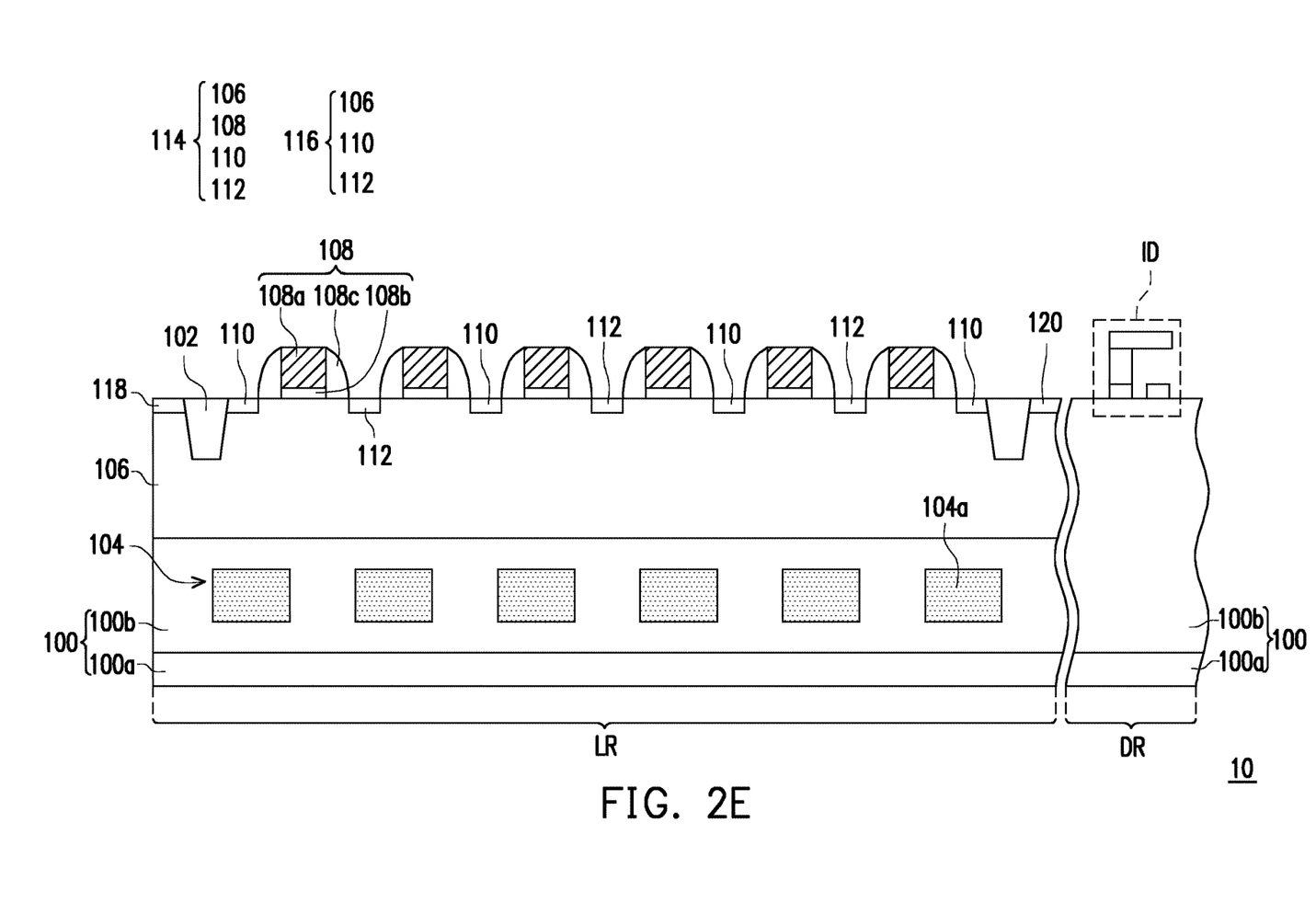

Referring to FIG. 1A and FIG. 2E, step S110 is performed, and gate structures 108 are formed over the substrate 100 within the logic region LR. In some embodiments, one or more gate structures 108 are formed over the active region AA. In some embodiments, the gate structure 108 includes a gate electrode 108a and a gate dielectric layer 108b located below the gate electrode 108a. In some embodiments, the gate dielectric layer 108b is disposed between the substrate 100 and the gate electrode 108a. In some embodiments, a material of the gate electrode 108a may include polysilicon or a metal material. For instance, the metal material may include Al or W. In some embodiments, a material of the gate dielectric layer 108b may include silicon oxide or a high-k dielectric material (of which dielectric constant is greater than 4). The high-k dielectric material may include $HfO_2$, $ZrO_2$, $Ta_2O_5$, $TiO_2$, $SrTiO_3$, $(Ba,Sr)TiO_3$ or a combination thereof. In some embodiments, the gate structure 108 may further include a barrier layer and/or a work function layer formed in between the gate electrode 108a and the gate dielectric layer 108b. In some embodiments, the gate structure 108 may further include a spacer 108c. In some embodiments, the spacer 108c is formed on a sidewall of the stacked structure of the gate electrode 108a and the gate dielectric layer 108b. For instance, a material of the spacer 108c may include silicon oxide, silicon nitride or a combination thereof. In some embodiments, the gate structures 108 are formed as parallel stripe-shaped structures. In some embodiments, a plurality of the gate structures 108 may be formed over the active region AA, and the gate structures 108 are spaced apart from each other. Those skilled in the art may adjust the amount, size or spacing of the gate structures 108, the present disclosure are not limited thereto.

In some embodiments, step S112 is performed, and a first doped region 110 and a second doped region 112 are formed in the second well 106 within the logic region LR. In some embodiments, the first doped region 110 and the second doped region 112 are formed within the active region AA. In some embodiments, the first doped region 110 and the second doped region 112 are spaced apart from each other. In some embodiments, for each gate structure 108, the first doped region 110 and the second doped region 112 are formed at opposite sides of the gate structure 108. That is, the gate structure 108 is sandwiched and located between the first doped region 110 and the second doped region 112. It is understood that the number of the gate structure 108, the numbers of the first doped region 110 or the number of the second doped region 112 is more than one and is not limited by the drawings shown herein. The first doped region 110 and the second doped region 112 have the same conductive type, but the conductive type of the second well 106 is different from or complementary to the conductive type of the first doped region 110 and the second doped region 112. For instance, the conductive type of the second well 106 is P type, whereas the conductive type of the first doped region 110 and the second doped region 112 is N type.

In some embodiments, the gate structure 108, the first doped region 110, the second doped region 112 formed in the second well 106 constitute a MOS transistor 114, of which the first doped region 110 and the second doped region 112 are served as source/drain regions. In some embodiments, the MOS transistor 114 may be a portion of the logic circuit within the logic region LR. Additionally, in some embodiments, the first doped region 110, the second well 106 and the second doped region 112 further constitute a parasitic BJT 116 below the MOS transistor 114. In some embodiments, the second well 106 may serve as a base of the BJT 116, and the first doped region 110 and the second doped region 112 may serve as a collector and an emitter of the BJT 116. In some embodiments, the BJT 116 is capable of conducting a sudden flow of electricity caused by an ESD/EOS event. That is, the BJT 116 can serve as an ESD/EOS protection device.

In some embodiments, the step of forming the integrated device ID (i.e., step S108) precedes the step of forming the gate structure 108 (i.e. step S110) and the step of forming the first doped region 110 and the second doped region 112 (i.e., step S112). In other words, the BJT 116 is formed after performing the extreme high temperature treatment or the fabrication of the integrated device ID. Due to the first well 104 arranged in the lightly doped region 100b above the heavily doped region 100a, the carrier concentration profile of the second well 106 (i.e., the base of the BJT 116) remains substantially unvarying, even going through the extreme high temperature treatment during the formation of the integrated device ID. Thus, the electrical characteristics of the BJT 116 will not be deteriorated or unpredictably altered, and the electrical performance of the BJT 116 can be well controlled. In other words, an ESD/EOS protection performance of the BJT 116 can be improved.

In FIG. 1A and FIG. 2E, step S114 is performed, and a first contact region 118 and a second contact region 120 are formed in the second well 106 within the logic region LR. In some embodiments, the first doped region 110 and the second doped region 112 are formed between the first contact region 118 and the second contact region 120. In some embodiments, the first contact region 118 and the second contact region 120 are located outside the active region AA and the isolation structure 102, and the isolation structure 102 is located between the first and second regions 110, 112 and the first and second contact regions 118, 120. In other words, the active region AA surrounded by the isolation structure 102 is located between the first contact region 118 and the second contact region 120. In some embodiments, the first contact region 118 and the second contact region 120 have the same conductive type that is the same as the conductive type of the second well 106. For instance, the conductive type of the second well 106, the first contact region 118 and the second contact region 120 is P type. In some embodiments, the BJT 116 is electrically connected between Vdd and Vss power lines of an electrostatic-sensitive device, so as to protect the electrostatic-sensitive device from ESD/EOS damage.

So far, the manufacturing of the semiconductor device 10 has been completed. Thereafter, a structure of the semiconductor device 10 will be described with reference to FIG. 2E.

Referring to FIG. 2E, the semiconductor device 10 includes the substrate 100, the first well 104, the second well 106, the first doped region 110 and the second doped region 112. The substrate 100 has the heavily doped region 100a and the lightly doped region 100b. The heavily doped region 100a and the lightly doped region 100b have a same conductive type. The lightly doped region 100b is disposed over the heavily doped region 100a. The first well 104 is disposed in the lightly doped region 100b, and has a conductive type complementary to the conductive type of the heavily doped region 100a and the lightly doped region 100b. The second well 106 is formed in the substrate 100 over the lightly doped region 100b. The second well 106 has the active region AA defined by the isolation structure 102. The location of the first well 104 overlaps the location of the second well 106. The first doped region 110 and the second doped region 112 are formed in the second well 106 within the active region AA, and spaced apart from each other. The first doped region 110 and the second doped region 112 have a same conductive type complementary to a conductive type of the second well 106. In some embodiments, the second well 106, the first doped region 110 and the second doped region 112 constitute the BJT 116. In alternative embodiments, the semiconductor device 10 further includes the gate structures 108. The gate structure 108 is disposed on the substrate 100 over the active region AA. In these embodiments, the gate structure 108, the first doped region 110, the second doped region 112 formed in the second well 106 constitute the MOS transistor 114.

In some embodiments, the semiconductor device 10 may further include the first contact region 118 and the second contact region 120. The first contact region 118 and the second contact region 120 are both formed in the second well 106. The first contact region 118 and the second contact region 120 have the same conductive type that is the same as the conductive type of the second well 106. The first doped region 110 and the second doped region 112 are disposed between the first contact region 118 and the second contact region 120. In some embodiments, the active region AA is surrounded by the isolation structure 102, and the first contact region 118 and the second contact region 120 are located outside the active region AA.

FIGS. 3A through 3D are top views respectively illustrating the active region AA, the first well 104 and the gate structures 108 according to some embodiments of the present disclosure. Thereafter, the arrangement and configuration(s) of the first well 104 relative to the arrangements of the active region AA and the gate structures 108 will be describe with reference to FIG. 3A through FIG. 3D.

Figure 3A:
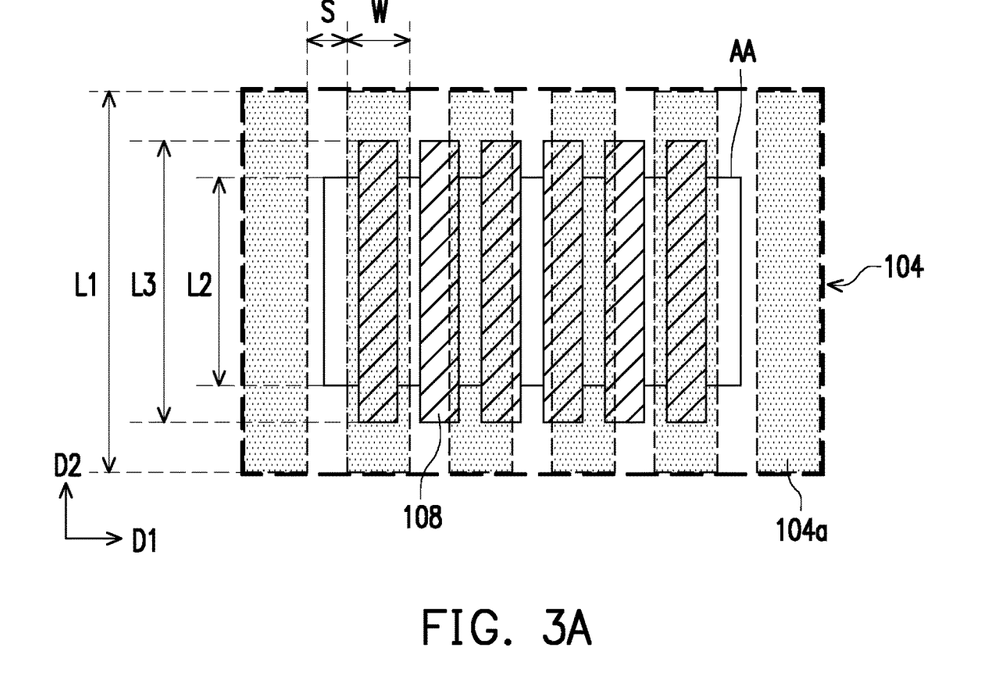

Referring to FIG. 3A, in some embodiments, the first well 104 includes a plurality of stripe-shaped sub-wells 104a parallel to one another. In some embodiments, the stripe-shaped sub-wells 104a are spaced apart from one another with a spacing S there-between. In some embodiments, the spacing S between the most adjacent stripe-shaped sub-wells 104a may be fixed. In alternative embodiments, the spacing between the most adjacent stripe-shaped sub-wells 104a may be varying. For instance, the spacing S between the adjacent stripe-shaped sub-wells 104a is greater than 0, and less than or equal to 5 μm. In some embodiments, from the top view, the span of the second well 106 or the span of the active region AA (part of the second well 106) overlaps the span of the first well 104 or the spans of the separate sub-wells 104a. In some embodiments, the distribution area of the stripe-shaped sub-wells 104a as a whole (shown in bold dashed line in FIG. 3A) is greater than the area of the active region AA. In some embodiments, each gate structure 108 may be formed in a stripe shape. The gate structures 108 and the stripe-shaped sub-wells 104a may extend along a same direction D2. In some exemplary embodiments, each stripe-shaped sub-well 104a has a length L1 (along the gate extending direction D2) and a width W (in a direction D1 perpendicular to the direction D2). In some embodiments, the width W of the sub-well 104a ranges from 2 μm to 10 μm. In some embodiments, the length L1 of each stripe-shaped sub-well 104a is greater than a length L2 (in the direction D2) of the active region AA. In some embodiments, the length L1 of the sub-well 104a is greater than a length L3 of each gate structure 108. Furthermore, in some exemplary embodiments, the distribution area of the stripe-shaped sub-wells 104a is greater than the distribution area of the gate structures 108. In alternative embodiments, the distribution area of the stripe-shaped sub-wells 104a is substantially equivalent to the distribution area of the gate structures 108. Those skilled in the art may adjust the size, spacing or distribution area of the stripe-shaped sub-wells 104a according to layout design requirements, and the scopes of the present disclosure are not limited thereto.

Figure 3B:
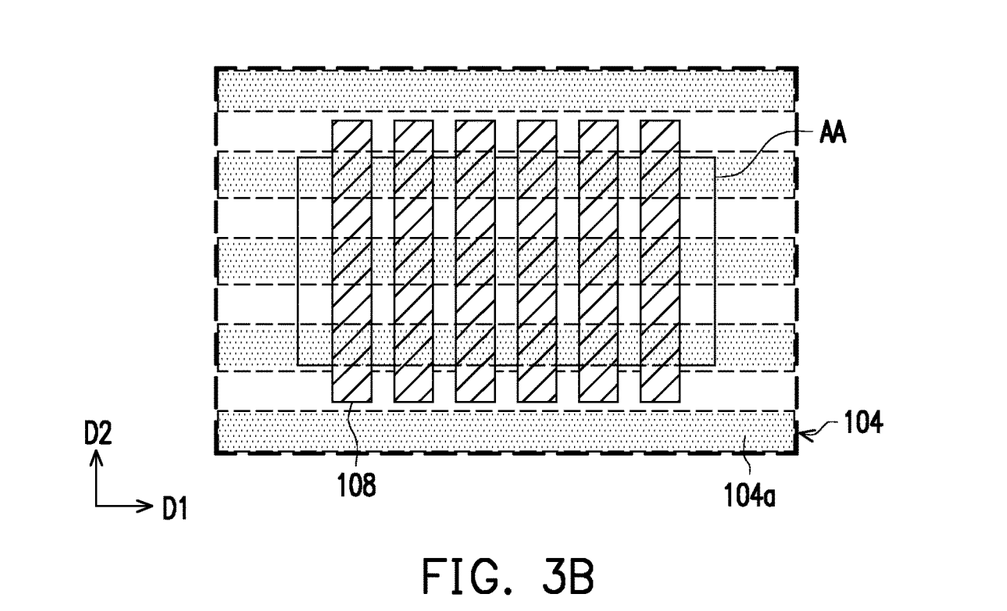

Comparing FIG. 3B with FIG. 3A, a major difference between the embodiments shown in FIG. 3A and FIG. 3B lies in that the extension direction of the stripe-shaped sub-wells 104a shown in FIG. 3B is intersected with the extension direction of the gate structures 108. In some exemplary embodiments, the extension direction of the stripe-shaped sub-wells 104a is perpendicular to the extension direction of the gate structures 108. For instance, the stripe-shaped sub-wells 104 extend along the direction D1, whereas the gate structures 108 extend along the direction D2. In some embodiments, the distribution area of the stripe-shaped sub-wells 104a is greater than the distribution area of the active region AA. In some exemplary embodiments, the distribution area of the stripe-shaped sub-wells 104a is greater than or equivalent to the distribution area of the gate structures 108.

Figure 3C:
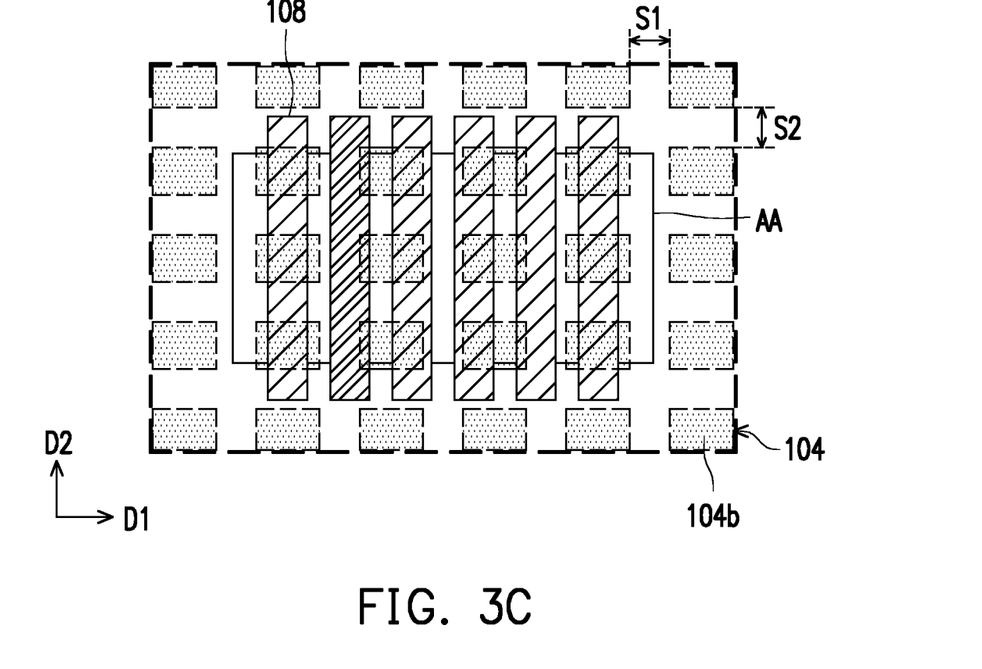

Referring to FIG. 3C, in some embodiments, the first well 104 may include a plurality of block-shaped sub-wells 104b. In some embodiments, the block-shaped sub-wells 104b are spaced apart from one another. In some embodiments, the block-shaped sub-wells 104b may be arranged in an array extended along the direction D1 and the direction D2. The direction D1 is intersected with the direction D2. A spacing S1 between adjacent block-shaped sub-wells 104b along the direction D1 may be greater than 0, and less than or equal to 5 μm. A spacing S2 between adjacent block-shaped sub-wells 104b along the direction D2 may also be greater than 0, and less than or equal to 5 μm. An area of each block-shaped sub-well 104b may be less than the area of the active region AA, whereas a distribution area of the block-shaped sub-wells 104b may be greater than the area of the active region AA. Furthermore, the distribution area of the block-shaped sub-wells 104b may be greater than the distribution area of the gate structures 108. Those skilled in the art may adjust the size, spacing or distribution area of the block-shaped sub-wells 104b according to design requirements, the scopes of the present disclosure are not limited thereto.

Figure 3D:
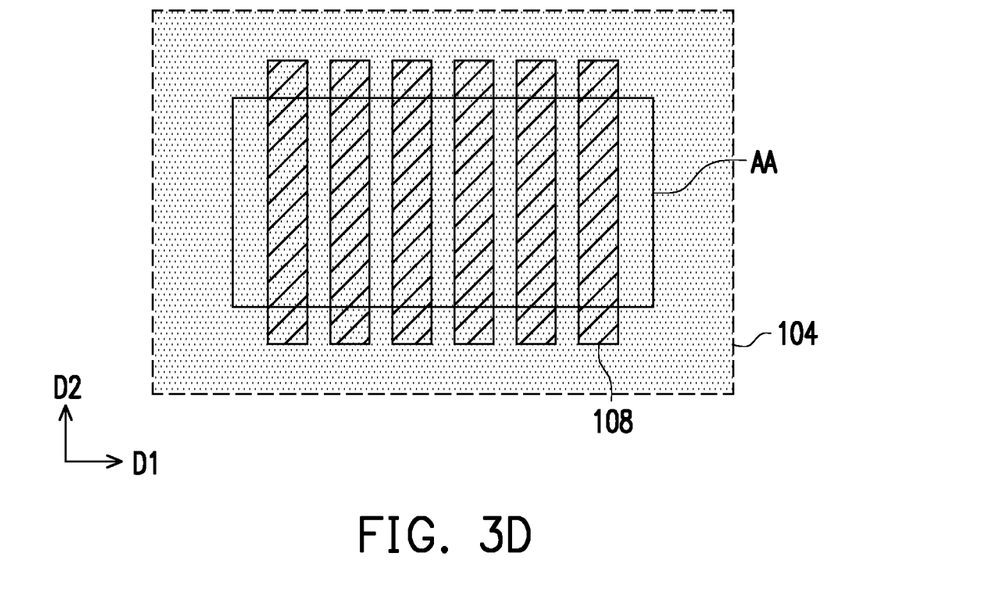

Referring to FIG. 3D, rather than including a plurality of separate sub-wells, the first well 104 in some embodiments may be a unified region. The first well 104 may span under the active region AA, and extend over or beyond the whole area of the active region AA. In these embodiments, an area of the first well 104 may be greater than the area of the active region AA. In some embodiments, the area of the first well 104 may be substantially equal to the area of the active region AA. In addition, the area of the first well 104 may be greater than, equal to or less than the distribution area of the gate structures 108. Those skilled in the art may adjust the size or of the first well 104 according to design requirements, the scopes of the present disclosure are not limited thereto.

Figure 4:
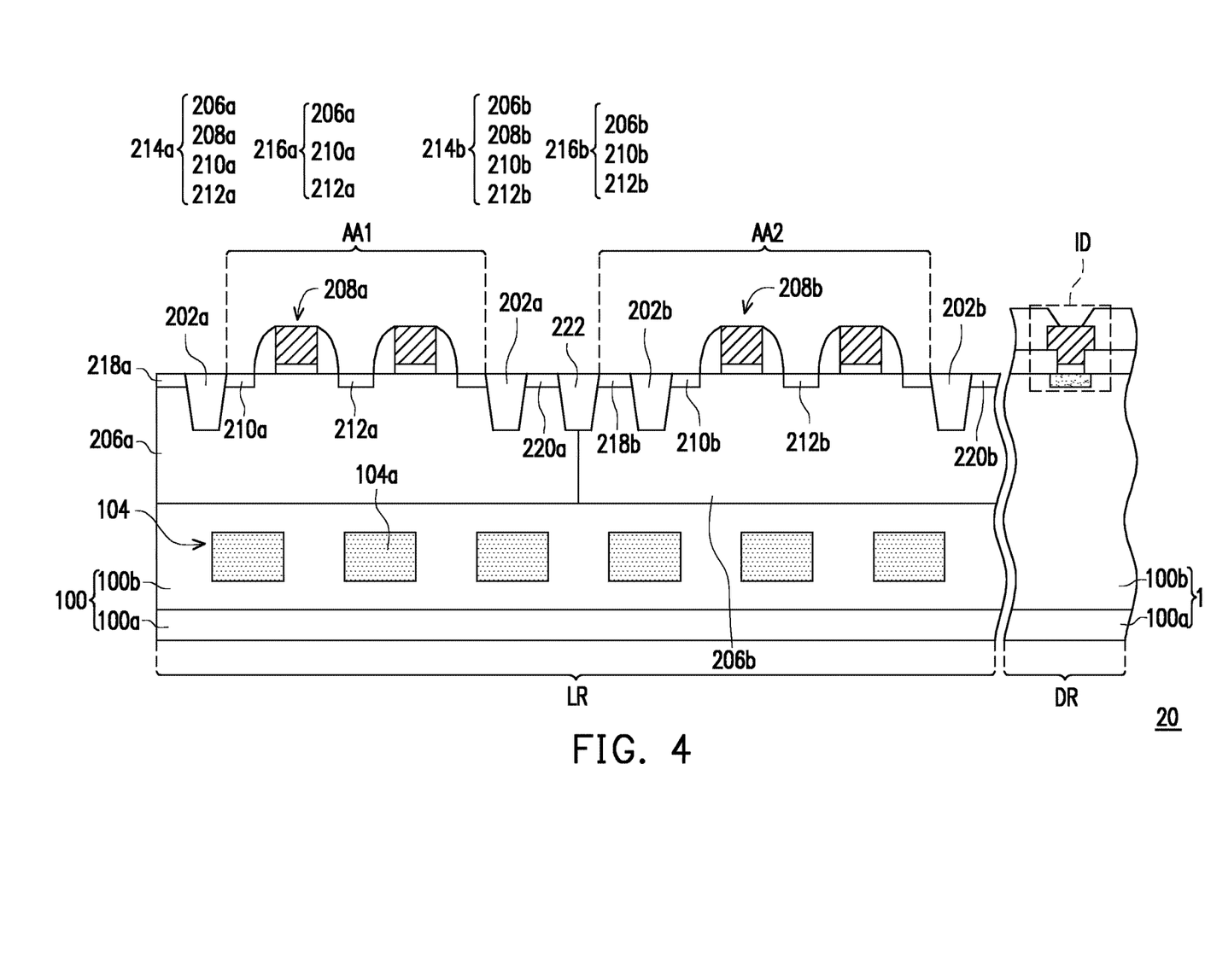
FIG. 4 is a schematic cross-sectional view illustrating a semiconductor device according to some embodiments of the present disclosure.

FIG. 4 is a cross-sectional view illustrating a semiconductor device 20 according to some embodiments of the present disclosure.

Referring to FIG. 2E and FIG. 4, the semiconductor device 20 is similar to the semiconductor device 10 shown in FIG. 2E. For simplicity, only differences between the semiconductor device 20 and the semiconductor device 10 will be discussed, the same parts or the like between the semiconductor device 20 and the semiconductor device 10 will not be repeated. In some embodiments, the semiconductor device 20 includes a second well 206a and a second well 206b within the logic region LR. A conductive type of the second well 206a is complementary to a conductive type of the second well 206b. For instance, the conductive type of the second well 206a is P type, whereas the conductive type of the second well 206b is N type. In some embodiments, an isolation structure 222 may be formed in the substrate 100, and located between the second well 206a and the second well 206b. An isolation structure 202a may formed in in the second well 206a, and an isolation structure 202b may be formed in the second well 206b. In some embodiments, an active region AA1 is defined by the isolation structure 202a, and an active region AA2 is defined by the isolation structure 202b. In some embodiments, the active region AA1 is surrounded by the isolation structure 202a, and the active region AA2 is surrounded by the isolation structure 202b. A first doped region 210a and a second doped region 212a are disposed in the second well 206a within the active region AA1. A gate structure 208a may be formed on the substrate 100 over the active region AA1, and between the first doped region 210a and the second doped region 212a. A first contact region 218a and a second contact region 220a may be disposed in the second well 206a. The isolation structure 202a may be located between the first contact region 218a and the second contact region 220a. Similarly, a first doped region 210b and a second doped region 212b are disposed in the second well 206b within the active region AA2. A gate structure 208b may be formed on the substrate 100 over the active region AA2, and between the first doped region 210b and the second doped region 212b. A first contact region 218b and a second contact region 220b may be disposed in the second well 206b. The isolation structure 202b may be located between the first contact region 218b and the second contact region 220b.

As a result, the gate structure 208a, the first doped region 210a and the second doped region 212a formed in the second well 206a constitute a MOS transistor 214a. In addition, a BJT 216a including the second well 206a, the first doped region 210a and the second doped region 212a is formed below the MOS transistor 214a. Similarly, the gate structure 208b, the first doped region 210b and the second doped region 212b formed in the second well 206b constitute a MOS transistor 214b. In addition, a BJT 216b including the second well 206b, the first doped region 210b and the second doped region 212b is formed below the MOS transistor 214b. In some embodiments, the integrated device ID formed within the integrated device region DR may be a sensor device.

As above, the formation of the deep counter well(s) in a specific region in the substrate helps to maintain a constant carrier concentration profile of the substrate under the transistor(s), which improves the electrical performance of the ESD/EOS protection device therein. The deep counter well is located between the heavily doped region of the substrate and the transistor(s). The conductive type of the deep counter well is complementary to the conductive type of the heavily doped region. Therefore, during an extremely high temperature thermal treatment, a consequence of out-diffusion of dopants from the heavily doped region to the transistor can be cancelled by a consequence of out-diffusion from the deep counter well to the transistor. Accordingly, an electrical characteristic of the transistor can be avoided from being altered by the extremely high temperature thermal treatment. Thus, the electrical characteristic of the transistor can be well controlled, and an ESD/EOS protection performance of the transistor can be improved.

In an aspect of the present disclosure, a semiconductor device is provided. The semiconductor device comprises: a substrate having a heavily doped region and a lightly doped region, wherein the heavily doped region and the lightly doped region have a same conductive type, and the lightly doped region is disposed over the heavily doped region; a plurality of first wells, disposed in the lightly doped region and arranged as an array, wherein the first wells have a conductive type opposite to the conductive type of the heavily doped region and the lightly doped region; a second well, disposed in the substrate over the lightly doped region, and having an active region defined by an isolation structure, wherein the first wells are overlapped with the second well, and top ends of the first wells are lower than a bottom end of the second well; and a plurality of first doped regions and a plurality of second doped regions, located in the second well within the active region, and spaced apart from each other, wherein the first and second doped regions have a conductive type, opposite to a conductive type of the second well.

In another aspect of the present disclosure, a semiconductor device is provided. The semiconductor device comprises: a semiconductor substrate, having a lightly doped region and a heavily doped region extending downwardly from a bottom end of the lightly doped region, wherein the heavily doped region and the lightly doped region have a same conductive type; first wells, disposed in the lightly doped region and arranged as an array, wherein the first wells have a conductive type opposite to the conductive type of the heavily doped region and the lightly doped region; a second well, disposed in the semiconductor substrate, wherein the lightly doped region extends downwardly from a bottom end of the second well, and top ends of the first wells are lower than the bottom end of the second well; bipolar junction transistors, formed in the second well, wherein each of the bipolar junction transistors comprises a first doped region, a second doped region and a portion of the second well extending between the first and second doped regions, a conductive type of the second well is opposite to a conductive type of the first and second doped regions, and adjacent ones of the bipolar junction transistors are connected with each other by one of the first doped regions or one of the second doped regions.

In yet another aspect of the present disclosure, a semiconductor device is provided. The semiconductor device comprises: a semiconductor substrate, having a heavily doped region and a lightly doped region distant from a top surface of the semiconductor substrate, wherein the heavily doped region extends downwardly from a bottom end of the lightly doped region; first wells, formed in the lightly doped region and separately arranged as an array, wherein a conductive type of the first wells is opposite to a conductive type of the heavily doped region and the lightly doped region; a second well, disposed in the semiconductor substrate and extending to a top end of the lightly doped region from the top surface of the semiconductor substrate, wherein top ends of the first wells are lower than a bottom end of the second well; and gate structures, formed on the top surface of the semiconductor substrate, wherein the second well, the lightly doped region, the first wells and the heavily doped region are overlapped with the gate structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having a heavily doped region and a lightly doped region, wherein the heavily doped region and the lightly doped region have a same conductive type, and the lightly doped region is disposed over the heavily doped region;
   a plurality of first wells, disposed in the lightly doped region and arranged as an array having multiple rows and multiple columns, wherein the first wells have a conductive type opposite to the conductive type of the heavily doped region and the lightly doped region, and an area of each of the first wells is smaller than an area of the active region;
   a second well, disposed in the substrate over the lightly doped region, and having an active region defined by an isolation structure, wherein the first wells are overlapped with the second well, and top ends of the first wells are lower than a bottom end of the second well; and
   a plurality of first doped regions and a plurality of second doped regions, located in the second well within the active region, and spaced apart from each other, wherein the first and second doped regions have a conductive type opposite to a conductive type of the second well.

2. The semiconductor device of claim 1, wherein the first wells are respectively formed in a rectangular shape.

3. The semiconductor device of claim 1, wherein a distribution area of the first wells is larger than an area of the active region.

4. The semiconductor device of claim 1, wherein the first wells are partially covered by the active region.

5. The semiconductor device of claim 1, wherein the active region is surrounded by the isolation structure, and the first wells are partially overlapped with the isolation structure.

6. The semiconductor device of claim 1, further comprising:
   a plurality of gate structures, disposed on the substrate, wherein the active region s overlapped with the gate structures.

7. The semiconductor device of claim 6, wherein the gate structures are respectively formed in a stripe shape, and overlap with a portion of the first wells.

8. The semiconductor device of claim 6, wherein the gate structures are respectively located between one of the first doped regions and one of the second doped regions.

9. The semiconductor device of claim 1, wherein the top ends of the first wells are lower than a top end of the lightly doped region.

10. The semiconductor device according to claim 1, wherein the second well extends from a top surface of the substrate to a top end of the lightly doped region.

11. A semiconductor device, comprising:
    a semiconductor substrate, having a lightly doped region and a heavily doped region extending downwardly from a bottom end of the lightly doped region, wherein the heavily doped region and the lightly doped region have a same conductive type;
    first wells, disposed in the lightly doped region and arranged as an array, wherein the first wells have a conductive type opposite to the conductive type of the heavily doped region and the lightly doped region;
    a second well, disposed in the semiconductor substrate, wherein the lightly doped region extends downwardly from a bottom end of the second well, and top ends of the first wells are lower than the bottom end of the second well;
    bipolar junction transistors, formed in the second well, wherein each of the bipolar junction transistors comprises a first doped region, a second doped region and a portion of the second well extending between the first and second doped regions, a conductive type of the second well is opposite to a conductive type of the first and second doped regions, and adjacent ones of the bipolar junction transistors are connected with each other by one of the first doped regions or one of the second doped regions.

12. The semiconductor device according to claim 11, wherein the first wells are separately arranged along rows and columns.

13. The semiconductor device according to claim 11, wherein the first and second doped regions of the bipolar junction transistors are located within an active region laterally surrounded by a trench isolation structure extending into the second well from a top surface of the semiconductor substrate.

14. The semiconductor device according to claim 13, wherein the array of the first wells is overlapped with the active region.

15. The semiconductor device according to claim 14, wherein a total area of the array of the first wells is greater than an area of the active region.

16. The semiconductor device according to claim 11, wherein bottom ends of the first wells are higher than a bottom end of the lightly doped region.

17. A semiconductor device, comprising:
- a semiconductor substrate, having a heavily doped region and a lightly doped region distant from a top surface of the semiconductor substrate, wherein the heavily doped region extends downwardly from a bottom end of the lightly doped region;
- first wells, formed in the lightly doped region and separately arranged as an array, wherein a conductive type of the first wells is opposite to a conductive type of the heavily doped region and the lightly doped region,
- a second well, disposed in the semiconductor substrate and extending to a top end of the lightly doped region from the top surface of the semiconductor substrate, wherein top ends of the first wells are lower than a bottom end of the second well; and
- gate structures, formed on the top surface of the semiconductor substrate, wherein the second well, the lightly doped region, the first wells and the heavily doped region are overlapped with the gate structures.

18. The semiconductor device according to claim 17, wherein the gate structures are respectively formed in a stripe shape, and are laterally spaced apart from one another.

19. The semiconductor device according to claim 17, further comprising:
- first doped regions and second doped regions, extending into the second well from the top surface of the semiconductor substrate, and having a conductive type opposite to a conductive type of the second well.

20. The semiconductor device according to claim 19, wherein the gate structures are respectively located between one of the first doped regions and one of the second doped regions.

* * * * *